United States Patent
Jarvis et al.

(10) Patent No.: US 6,452,412 B1
(45) Date of Patent: Sep. 17, 2002

(54) DROP-IN TEST STRUCTURE AND METHODOLOGY FOR CHARACTERIZING AN INTEGRATED CIRCUIT PROCESS FLOW AND TOPOGRAPHY

(75) Inventors: Richard W. Jarvis; Iraj Emami, both of Austin, TX (US); Charles E. May, Gresham, OR (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/262,238

(22) Filed: Mar. 4, 1999

(51) Int. Cl.$^7$ ............................................... G01R 31/26
(52) U.S. Cl. ........................................ 324/765; 438/17
(58) Field of Search ................................ 324/765, 754, 324/158.1, 763; 438/18, 17; 714/721

(56) References Cited

U.S. PATENT DOCUMENTS

| | | |
|---|---|---|
| 3,751,647 A | 8/1973 | Maeder et al. |
| 3,842,491 A | 10/1974 | Depuy et al. |
| 3,983,479 A | 9/1976 | Lee et al. |
| 4,347,479 A | 8/1982 | Cullet |
| 4,670,710 A | 6/1987 | Beha et al. |
| 4,855,253 A | 8/1989 | Weber |
| 5,051,690 A | 9/1991 | Maly et al. |
| 5,159,752 A | 11/1992 | Mahant-Shetti et al. |
| 5,514,974 A | 5/1996 | Bouldin |
| 5,576,223 A | 11/1996 | Zeininger et al. |
| 5,773,315 A | 6/1998 | Jarvis |
| 5,801,394 A | 9/1998 | Isobe |
| 5,821,761 A | 10/1998 | Shida et al. |
| 5,959,459 A | 9/1999 | Satya et al. |
| 6,016,062 A | 1/2000 | Nicollian et al. |
| 6,121,065 A * | 9/2000 | Wong et al. ............ 324/765 |
| 6,294,397 B1 * | 9/2001 | Jarvis et al. ............ 438/11 |

* cited by examiner

Primary Examiner—N. Le
Assistant Examiner—James Kerveros
(74) Attorney, Agent, or Firm—Kevin L. Daffer; Conley, Rose & Tayon P.C.

(57) ABSTRACT

A drop-in test structure fabricated upon a production integrated circuit elevational profile and a method for using the drop-in test structure for characterizing an integrated circuit production methodology are described. The test structure may be fabricated upon an integrated circuit elevational profile formed according to a subset of steps within a sequence of steps of the integrated circuit production methodology that culminates in a production integrated circuit intended for use by a consumer. According to an embodiment, the integrated circuit elevational profile may be fabricated according to a majority of the sequence of steps. Alternatively, the integrated circuit elevational profile may be fabricated according to a minority of the sequence of steps. The test structure may be fabricated upon die sites designated to receive the test structure. Alternatively, the test structure may be fabricated upon die sites otherwise intended for operable integrated circuits. In an embodiment, test structures may be fabricated upon only selected die sites. Alternatively, test structures may be fabricated across the entire wafer to characterize spatial variation in process parameters. The test structures may be used to characterize the underlying elevational profile and to identify both systematic and random defects either as part of routine monitoring or in response to the observance of defective chips using other monitoring.

8 Claims, 9 Drawing Sheets

```
┌─────────────────────────────────────────────┐
│ FORM A PLURALITY OF INTEGRATED CIRCUIT      │
│ ELEVATIONAL PROFILES UPON A PLURALITY       │
│ OF WAFERS                                   │
│ 502                                         │
└─────────────────────────────────────────────┘
                      ↓
┌─────────────────────────────────────────────┐
│ ESTABLISH AN INVENTORY OF TEST WAFERS       │
│ FROM A SUBSET OF THE WAFERS                 │
│ 504                                         │
└─────────────────────────────────────────────┘
                      ↓
┌─────────────────────────────────────────────┐
│ SELECT AT LEAST ONE WAFER FOR TESTING       │
│ FROM THE SUBSET OF WAFERS                   │
│ 506                                         │
└─────────────────────────────────────────────┘
                      ↓
┌─────────────────────────────────────────────┐
│ FORM A TEST STRUCTURE UPON THE SELECTED     │
│ WAFER                                       │
│ 508                                         │
└─────────────────────────────────────────────┘
                      ↓
┌─────────────────────────────────────────────┐
│ EXAMINE THE TEST STRUCTURE FOR DEFECTS      │
│ 510                                         │
└─────────────────────────────────────────────┘
```

DROP-IN TEST STRUCTURE AND METHODOLOGY FOR CHARACTERIZING AN INTEGRATED CIRCUIT PROCESS FLOW AND TOPOGRAPHY

BACKGROUND OF THE INVENTION

1. Field of the Invention

This invention relates to integrated circuit fabrication and, more particularly, to a drop-in test structure fabricated upon a production integrated circuit elevational profile for characterizing an integrated circuit process.

2. Description of the Related Art

Fabrication of integrated circuits requires that precisely controlled quantities of impurities be introduced into small regions of a semiconductive substrate and that these regions be interconnected to create microelectronic components and integrated circuits. The patterns used to define such regions and interconnections are created using lithographic processes. To form the patterns, layers of photoresist material are applied as thin films to the upper surfaces of the substrate or to elevational profiles successively built upon the substrate. The photoresist is selectively exposed to a form of radiation such as specific optical wavelengths, ultraviolet light ("UV light"), X rays, or electrons. An exposure tool and mask are used to effect the exposure to UV light or X rays, while a data tape is used in electron beam lithography.

The exposure mask includes clear and opaque regions that define the features to be patterned in the photoresist. Areas of the photoresist exposed to radiation may be rendered preferentially soluble or insoluble, relative to unexposed photoresist, in a developing solvent. The change in solubility depends upon the type of photoresist used. Following development of the photoresist, the patterned photoresist is used as a mask during removal of exposed portions of the underlying substrate or conductive materials such as polycrystalline silicon or metal. As such, the pattern is transferred from the exposure mask to the integrated circuit topography. Similar lithography techniques are used to pattern photoresist above portions of the substrate and conductive features (e.g., gate conductors) to selectively block ion implantation when impurities are introduced into the substrate (e.g., during source and drain formation).

Projection printing is the predominant method used for optically transferring a pattern from an exposure mask to a photoresist-coated wafer. In projection printing, wafers are separated from the masks by large distances. Lens elements or mirrors are used to focus the mask image onto the photoresist. Current projection printing systems use refractive optics to project the mask image onto the photoresist. Because it is impractical to build a refractive lens capable of projecting an image across an entire wafer, refractive systems project the image across a portion of the wafer. The projection field is then moved across the wafer using a "step-and-repeat" procedure. Masks used with step-and-repeat aligners are commonly referred to as "reticles" to distinguish them from masks that project images across an entire wafer.

The manufacture of semiconductor integrated circuits involves a loss of chip yield due to the presence of various defects. The two basic types of defects that may occur when conductive layers are formed on an integrated circuit are extra material defects ("EMD") and missing material defects ("MMD"). EMD may occur when the conductive structures include material extending beyond predefined boundaries. Such material may extend to another conductive structure, causing a "short" to be formed between the two conductive structures. MMD may occur when a gap is formed in a conductive structure. Such a defect may cause the formation of an "open" conductive structure in which the continuity of the conductive structure is broken.

Defects that occur in a regular or repeating pattern typically result from shortcomings in the processing methodology, such as misalignment of a reticle or tilt of the wafer. These defects are known as systematic defects. In contrast, random defects occur without a pattern. Both EMD and MMD may be either systematic or random defects. For example, systematic problems in step coverage across areas of large elevational disparity may lead to the formation of open circuits due to missing material at the step. As another example, short circuits may be formed due to random distribution of particulate matter upon the die (which may result in connections between adjacent conductive lines) or upon the reticle used to pattern the die (which may result in conductive material between adjacent lines being retained rather than removed due to undesired masking by the particulate matter).

In order to detect defects that arise during fabrication of integrated circuits, test structures may be formed upon designated sites on a semiconductor wafer. Formation of the test structures may include multiple processing steps different from processes used to form production integrated circuits. For example, different reticles may be used to pattern successive layers of the test structures than are used to pattern the production die. As such, the elevational profile of a test structure that includes multiple layers of patterned conductive material may differ from the elevational profile of neighboring integrated circuits. Consequently, such test structures may not give an accurate indication of systematic problems that may occur due to elevational disparity in the production integrated circuit or random problems that occur in a production setting.

Alternatively, a small area within a production die may be reserved for a test device or devices. Test devices so formed may avoid the problems associated with using non-production reticles for successive layers of the test elevational profile. Forming test structures as part of a production die, however, significantly reduces the area available for the test structures. As such, random defects occurring with low frequency might not be detected.

SUMMARY OF THE INVENTION

The problems outlined above may be solved by the technique hereof for forming and using a test structure for characterizing a production integrated circuit fabrication methodology ("production methodology") and a production integrated circuit topography ("production topography") formed using the production methodology. As used in this application, "production integrated circuit topography" describes a topography that is contained within a packaged integrated circuit intended for use by a consumer of a product including the integrated circuit as an integral component. That is, a production topography is descriptive of an integrated circuit die that has been scribed, separated from a wafer, tested, packaged, and shipped. "Production integrated circuit fabrication methodology" describes a process for fabricating a production integrated circuit topography.

A production integrated circuit elevational profile ("production elevational profile" or "production profile") as used in this application refers to a set of sequentially formed elevational features encompassing a subset of a production topography. That is, a production profile is formed according to a subset of the sequence of steps constituting the production methodology, whereas as a production topography is formed according to a complete production methodology sequence. More specifically, a production profile is formed according to processing steps that occur prior to dicing the wafer (i.e., separating a complete wafer into individual chips or die). As such, a production profile is distinguishable from an elevational profile intended strictly to be used for testing purposes and not intended to function in whole or in part as an operable component of an electronic device.

A production topography is considered to be elevationally complete prior to scribing and separation of the die from the wafer. As such, a production profile may represent either a substantially elevationally complete production topography or a partially complete production topography. That is, according to an embodiment, a production elevational profile may be formed by a majority of steps used to produce the integrated circuit. According to an alternative embodiment, a production elevational profile may be formed by a minority of steps used to produce the integrated circuit. The production profile includes both features that determine elevational disparity of the production topography (such as conductive lines) and features that do not impact upon elevational disparity (such as source and drain impurity distributions).

The production methodology may include using a step-and-repeat process of patterning successively deposited conductive layers. A test reticle having a test pattern thereon may be substituted for a production reticle and used to pattern the test structure upon select die of the wafer. Preferably, the test structure occupies substantially an entire chip or die when patterned, so that the test structure may be used to detect random events occurring with low frequency. According to an embodiment, the test structure may be patterned upon a substantially complete production elevational profile (i.e., an elevational profile that has undergone a majority of the production methodology). According to an alternate embodiment, the test structure may be patterned upon an upper surface of a partially completed production elevational profile (i.e., an elevational profile that has undergone a minority of the production methodology). That is, the test structure may be patterned upon an elevational profile that is not itself a complete topography but that is capable of functioning as part of an integrated circuit if processing is completed.

According to an embodiment, a test reticle may be used to pattern select chip sites upon a wafer. The select chip sites may include sites previously selected to receive test structures as part of routine monitoring of the fabrication process. For example, test structures may be formed upon several pre-selected sites of a single wafer on, e.g., a daily or weekly basis to ensure that the resulting product chips meet design criteria. Alternatively, the select sites may be patterned with the test reticle rather than a production reticle in response to problems discovered during testing of finished production wafers. For example, electrical testing of finished wafers may reveal defects in the chips. As such, the test reticle may be used to pattern test structures upon selected chip sites of wafers at various stages of production to isolate critical processing steps at which the defects are introduced. In this embodiment, the selected chip sites are sites that otherwise would have been used for fabricating production integrated circuit topographies (i.e., the selected sites are not previously dedicated test sites). Further action may then be taken to identify the processing conditions or equipment responsible for the defects and to effect repairs or changes necessary to produce usable product. Test structures may be formed with an increased frequency (e.g., upon one or more wafers in each batch loaded into the process to be corrected) until the problem is resolved.

According to a further alternative, test structures may be formed across an entire wafer to enable identification of intra-wafer variations in processing. For example, formation of test structures across an entire wafer may reveal a regular pattern of defects across the wafer attributable to systematic errors in processing. Forming test structures across an entire wafer may also reveal that processing conditions vary between the center of the wafer and the edges such that functioning integrated circuits will be produced only in certain regions of the wafer rather than across the entire wafer. According to this embodiment, the test structures may be formed either on substantially complete or on partially complete production elevational profiles.

The test structure may include alternating grounded and floating conductive lines. Floating conductive lines are defined to be lines that are neither grounded nor powered during the optical testing of the test structure. Stimuli may be applied to the test structure in order to detect the presence of defects in the test structures. According to an embodiment, the stimuli may be electrons applied by an electron microscope. The wafer upon which the test structure is formed may be placed in a scanning electron microscope ("SEM") and irradiated with electrons. The test structure preferably allows for a rapid optical inspection to determine if defects are present.

When the test structure is irradiated with electrons (that is, during "voltage contrast inspection"), conductive lines that are floating will emit more electrons than grounded conductors will. This occurs because the grounded conductors absorb a portion of the electrons directed toward them, thus emitting fewer electrons than the floating conductive lines. If a defect is present that causes a short between a grounded and an ungrounded line, the two lines will emit about the same quantity of electrons. During a scan of the test structure, the lines may appear as an alternating series of bright (i.e., reflecting more electrons) and darkened (i.e., reflecting fewer electrons) conductive lines. If a defect is present in the test structure, this condition may be detected by scanning the test structure while the structure is being irradiated with electrons. If a floating and grounded line are shorted to each other, a portion of the floating line in the vicinity of the defect will appear to be darkened, thus readily signaling, by inspection scan, the presence of a defect.

An advantage of this test structure and testing method is that the presence and location of the defect may be readily determined. If a short occurs between a floating and a grounded line, the floating line will appear darkened in the vicinity of the short. Thus, when the region in which the defect is present is scanned, a change in the electronemitting appearance of a conductive line will occur. Without being bound by theory, it is thought that, due to the resistivity of the conductive lines, most low-power electrons striking the floating line will be emitted before they can travel to the extra material and then to ground. The proportion of electrons able to travel to ground is thought to increase with increasing proximity to the short. Thus, this method allows not only the detection of extra material defects, but also allows a rapid method of determining the location of the defect. This avoids scanning the entire test structure. Voltage contrast inspection allows a much coarser scan since a much larger area of the test structure will appear altered due to the presence of a defect.

Missing material defects in the grounded conductive line may also be found using a voltage contrast detection method. If a defect is present on a conductive line that is grounded, such that the continuity of the conductive line is broken, a portion of the conductive line will now be floating. During inspection, while the test structure is irradiated with electrons, the floating portion of the conductive line will glow, while the grounded portion of the conductive line will be darkened. By scanning a portion of the test structure near the point of grounding, and a portion of the test structure farther away from the point of grounding, an open in a grounded conductive line may be detected. The scanned portions may represent only a fraction of the total area of the test structure. This offers an advantage over conventional optical inspections, which may require scanning the entire test structure to determine the presence of opens in a conductive line. By minimizing the area required for scanning, the test structure may be used to quickly validate a process step involving the formation of conductive features.

In an embodiment, the test structure includes at least two conductive lines. The first conductive line is preferably coupled to ground. The second conductive line is preferably floating. The lines are formed on the upper surface of a production integrated circuit elevational profile. A transistor may be coupled to the first conductive line such that the transistor couples the first conductive line to the ground. The transistor is preferably a depletion-mode transistor. When a voltage is applied to the transistor, the transistor is configured to disconnect the first conductive line from the ground, thus rendering the first conductive line floating. The transistor may be coupled to a pad. The pad is preferably configured such that a voltage applied to the pad causes the transistor to disconnect the first conductive line from ground. An advantage of placing a transistor between the conductive line and the ground is that the line can be switched from a grounded to floating state. This allows the test structure to be used for a variety of testing techniques, including non-grounded electrical testing. Examples of test methods with which the above described test structure may be used include, but are not limited to, voltage contrast inspectability, basic particle size distribution, grounded electrical testing, and non-grounded electrical testing.

When compared to optical testing (such as basic particle side distribution testing), voltage contrast inspection and electrical testing have the advantage of allowing detection of very small defects and/or defects having low contrast with the background. As such, voltage contrast inspection and electrical testing provide increased signal-to-noise discrimination. Voltage contrast inspection has the further advantage of proceeding rapidly, such that test results may be obtained in a matter of hours. By way of comparison, several days may pass before electrical testing results are available. The ability to obtain results rapidly, thus minimizing manufacturing down time and/or production of defective materials during testing, is of great economic benefit to integrated circuit fabricators.

The first conductive line is preferably formed in a comb-like structure. The first conductive line preferably includes a main body portion with projections extending from the main body portion. The second conductive line is preferably routed in a serpentine fashion around the projections of the first conductive line. The second conductive line may be positioned such that a distance between the first and second conductive lines is constant.

The test structure may also include additional conductive lines. A third conductive line coupled to ground and a fourth floating line may also be incorporated into the test structure. The third line is preferably coupled to ground through a transistor. The transistor is preferably a depletion-mode transistor. When a voltage is applied to the transistor, the transistor is configured to disconnect the third conductive line from ground, thus rendering the third conductive line floating.

When four conductive lines are incorporated into the test structure, two of the lines, preferably the first and the fourth conductive lines, are comb-like lines. Both the first and fourth lines include projections extending out from a main portion of the conductive lines. The projections extend toward and away from the opposing conductive line. Sandwiched between the comb-like first and fourth lines, the second and third conductive lines are routed in serpentine fashion between the projections of the first and fourth lines. Preferably the spacing between all of the lines is substantially constant such that at any given point the distance between neighboring lines is substantially the same. The use of comb-like and serpentine lines allows a greater surface area of the integrated circuit elevational profile to be covered while maintaining a minimal number of conductive lines. The use of comb-like and serpentine lines also improves discriminating between open and shorting defect mechanisms.

The width of the individual conductive lines may be varied to allow testing of the production of wide conductive lines coupled to narrow conductive lines on the integrated circuit elevational profile. Alternatively, the conductive lines may be formed such that all of the conductive lines have substantially the same width and a constant spacing between the conductive lines. By forming conductive lines having the same width and spacing, the test structure may be used for particle size testing, as well as defect detection. The conductive lines are preferably formed from a conductive material during the formation of conductive features on other parts of the integrated circuit elevational profile. Examples of conductive materials include, but are not limited to, conductive metals (such as aluminum, titanium, and cobalt) and silicided polysilicon.

In another embodiment, the stimuli applied to the test structure may be electrons from an electrical tester. Test pads may be incorporated into the test structure. When defects are detected in a test structure using an inspection, as described above, the presence of defects may be electrically verified. By incorporating test pads into the structure, the presence of extra material defects and missing material defects may be detected electrically. The test pads are attached to each of the conductive lines to allow electrical testing of the conductive lines. The test pads are preferably connected to the conductive lines to allow testing of shorts between the lines and to find opens in the conductive lines. The pads are preferably placed at opposed ends of a conductive line to allow testing of the continuity of the entire conductive line. Extra material defects may be detected by electrically testing for connectivity between the conductive lines of the test structure. Missing material defects may be detected by testing for continuity of a conductive line.

BRIEF DESCRIPTION OF THE DRAWINGS

Other objects and advantages of the invention will become apparent upon reading the following detailed description and upon reference to the accompanying drawings in which.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Figure 1:
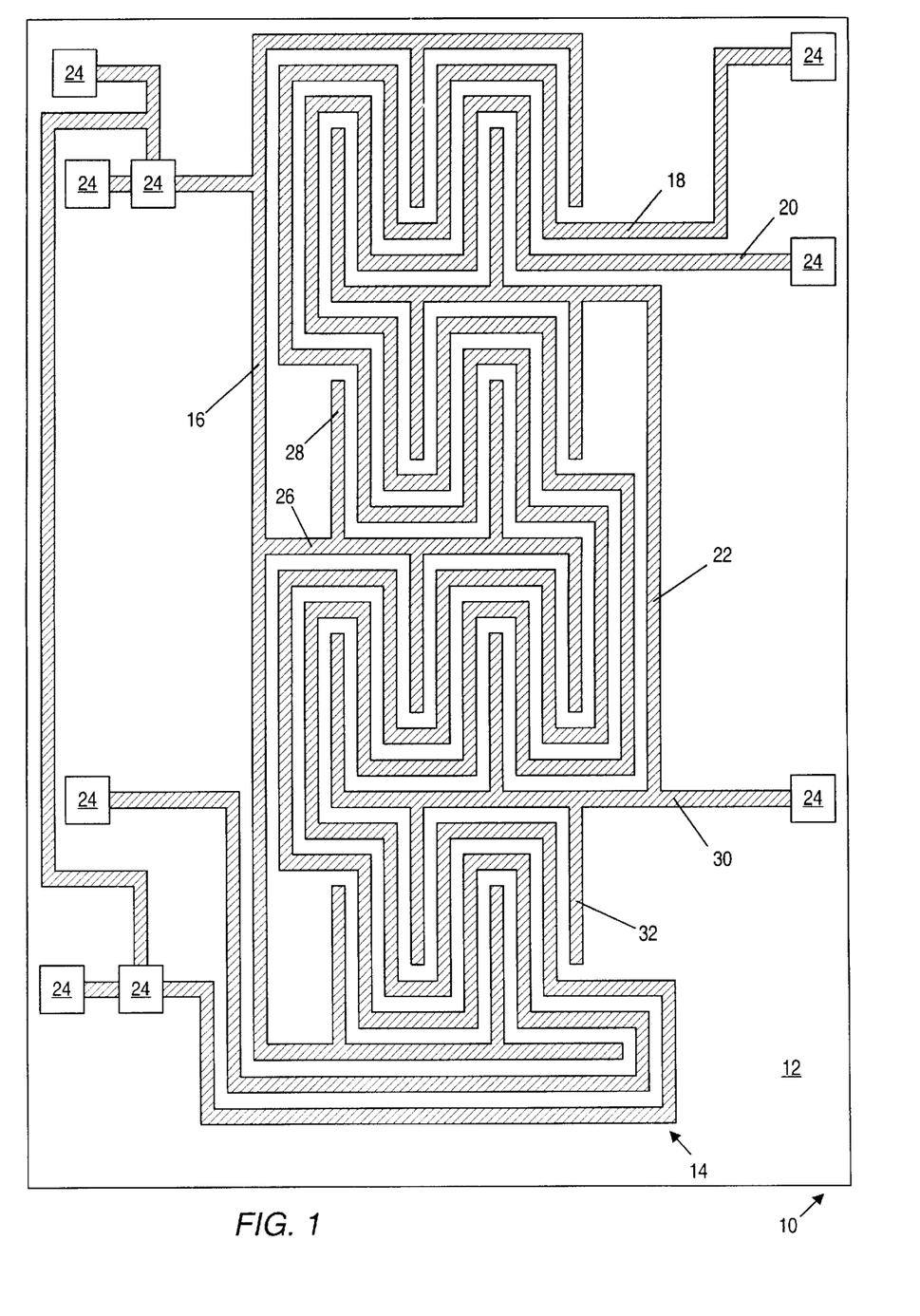
FIG. 1 depicts a top view of a test reticle that may be used to pattern a test structure upon an integrated circuit elevational profile.

Turning now to the drawings, FIG. 1 depicts a top view of an embodiment of a test reticle that may be used to pattern a test structure upon an integrated circuit elevational profile. Test reticle 10 preferably includes a plate 12 upon which a test pattern is formed. A test pattern 14 is depicted in FIG. 1. Test pattern 14 includes combs 16 and 22, which include projections 28 and 32, respectively, extending from main portions 26 and 30. Serpentine structures 18 and 20 are routed around combs 16 and 22. Test pattern 14 preferably further includes probe pads 24 at the ends of each of the combs and serpentines. The widths of the combs and serpentines, as well as the spacing between them, are preferably selected to correspond to the linewidths and separation between conductive interconnect lines that may be formed as part of a production integrated circuit.

As depicted in FIG. 1, the widths of the pattern lines are substantially similar to one another. Similarly, the spacings between lines are substantially similar. The linewidths and spacings, however, may differ among the various lines. Additionally, although the lines and the spacings between them are depicted as substantially constant, a portion of at least one of the lines may be wider than the remainder of the line in order to test the patterning of coupling between wider lines and narrower lines. Similarly, a portion of at least one of the spacings between lines may be wider than the remainder of the spacing in order to test the patterning of spacing between lines.

Preferably, test pattern 14 is designed such that a test structure formed using the test reticle covers substantially the entire area of a chip or die on a semiconductor wafer that is covered by a production integrated circuit topography. Alternatively, the test pattern may be used to form a test structure covering less than the area of a chip or die. It should be noted that the test pattern depicted in FIG. 1 is greatly simplified for purposes of illustration. It should also be noted that although test pattern 14 is depicted as including four conductive lines, test reticles may include test patterns having a different number of conductive lines (e.g., a single comb and a single serpentine).

Figure 2:
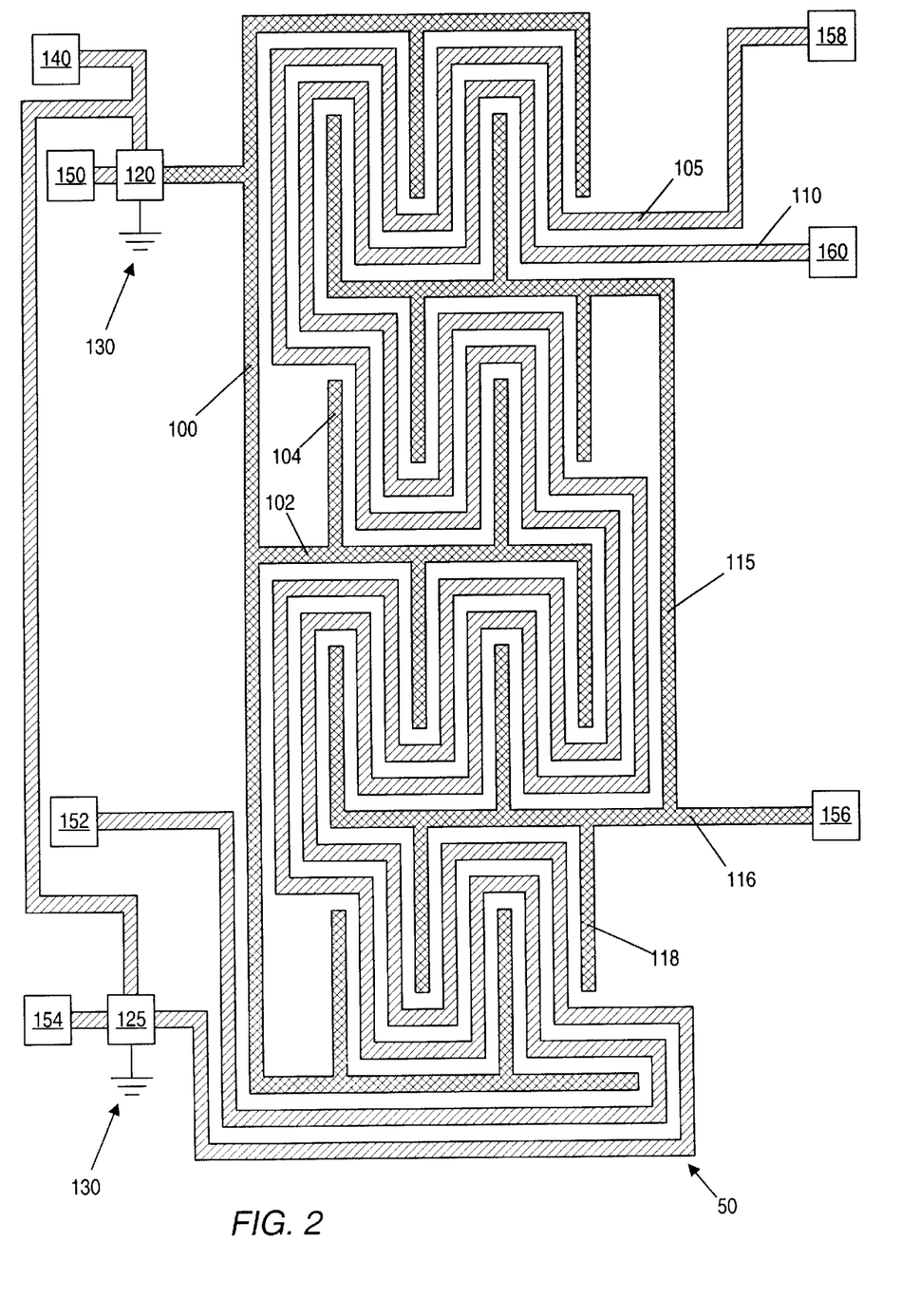
FIG. 2 depicts a top view of a test structure that has been patterned upon an integrated circuit elevationa profile.

FIG. 2 illustrates a top view of a test structure formed upon an integrated circuit elevational profile using a reticle similar to test reticle 10. It is to be noted that test structure 50, like test pattern 14 depicted in FIG. 1, is greatly simplified for illustrative purposes. The actual reticle test patterns and test structures may cover a substantially larger area with correspondingly greater complexity.

As depicted in FIG. 2, the widths of the conductive lines are substantially similar to one another. Similarly, the spacings between lines are substantially similar. The linewidths and spacings, however, may differ among the various lines. Additionally, although the conductive lines and the spacings between them are depicted as substantially constant, a portion of at least one of the conductive lines may be wider than the remainder of the line in order to test the coupling of wider lines to narrower lines. Similarly, a portion of at least one of the spacings between lines may be wider than the remainder of the spacing in order to test the patterning of spacing between conductive lines.

Preferably, test structure 50 covers substantially the entire area of a chip or die on a semiconductor wafer that is covered by a production integrated circuit topography. Alternatively, the test structure may cover less than the area of a chip or die. It should be noted that the test structure depicted in FIG. 2 is greatly simplified for purposes of illustration. It should also be noted that although test structure 50 is depicted as including four conductive lines, test structures having a different number of conductive lines (e.g., a single comb and a single serpentine) may be formed.

As shown in FIG. 2, first conductive line 100 is a comb-like line. First conductive line 100 preferably includes a main portion 102 with projections 104 extending from the main portion. First conductive line 100 is coupled to ground 130 via first transistor 120. First transistor 120 is preferably a depletion-mode MOSFET transistor. An n-channel depletion-mode MOSFET or a p-channel depletion-mode MOSFET may be used.

Figure 3:
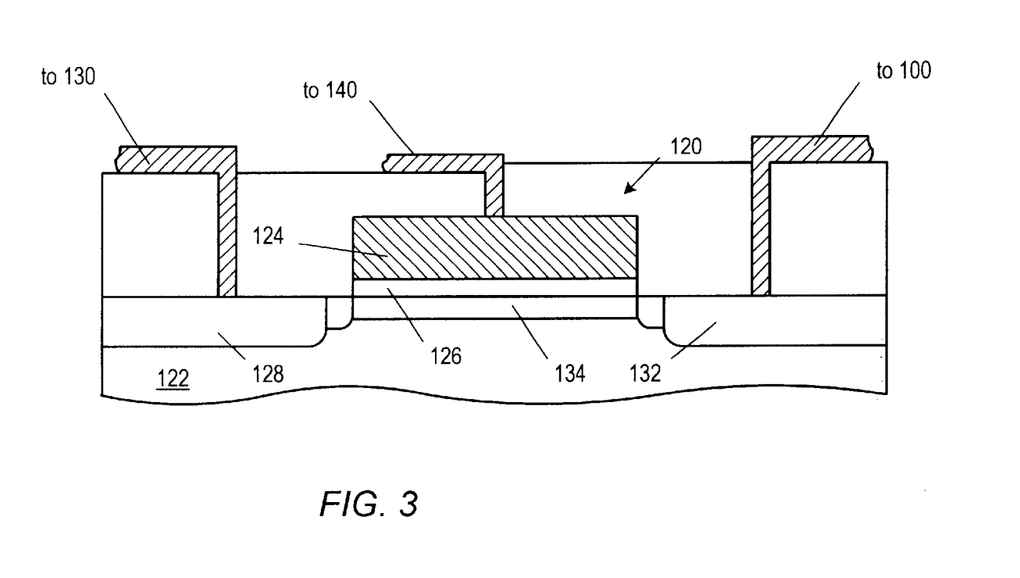
FIG. 3 depicts a cross-sectional view of a depletion-mode transistor coupled to a conductive line in a test structure.

FIG. 3 depicts a partial cross-sectional view of an integrated circuit elevational profile upon which a depletion-mode MOSFET is formed. The depletion-mode MOSFET includes a gate conductor 124, a gate dielectric 126, a source region 128, a drain region 132, and a channel region 134. The channel region 134 is diffused between the source and the drain, with the same type of impurity as used for the source/drain diffusion. Source region 128 is coupled to ground 130, drain region 132 is coupled to the first conductive line 100, and the gate 124 is coupled to a pad 140 configured to receive an electrical probe. When the gate to source voltage is zero (i.e., $V_{gs}=0$), the source and drain regions are connected via the channel region, thus coupling the first conductive line to ground 130.

If the gate-to-source voltage is increased (i.e., made negative for an n-channel transistor or positive for a p-channel transistor), the channel region will become less conductive. The gate-to-source cutoff voltage is defined as the voltage at which the current between the source and drain is reduced to a negligible value. Thus, by applying a voltage to the gate of the transistor equal to or greater than the gate-to-source cutoff voltage, the first conductive line 100 may be disconnected from ground 130. By disconnecting first conductive line 100 from ground 130, the first conductive line will become a floating line.

Returning to FIG. 2, first transistor 120 may be coupled to a pad 140. Pad 140 is configured to receive an electrical probe. An electrical probe may be used to apply a voltage that is sufficient to cause the transistor to disconnect the first conductive line from ground 130. An advantage of placing a depletion-mode transistor between the conductive line and the ground is that the conductive line may be switched from a grounded to floating state. By switching the line from grounded to floating, electrical testing may be performed. This allows the test structure to be used for a variety of testing methods. Examples of test methods with which the above described test structure may be used include, but are not limited to, voltage contrast inspection, basic particle size distribution, grounded electrical testing, and non-grounded electrical testing. The first conductive line is also coupled to pad 150, which is configured to receive an electrical probe. Pad 150 may be used for electrical testing of the test structure. By comparing the observed current conducted by the probed lines with the expected current, the presence of defects in the lines may be detected.

Second and third conductive lines are preferably formed to meander through the comb-like projections of the first conductive line 100 and fourth conductive line 115. Second conductive line 105 is preferably a floating line. Third conductive line 110 is preferably coupled to ground 130 through second transistor 125. Second transistor 125 is preferably a depletion-mode MOSFET transistor similar to first transistor 120. Second transistor 125 is preferably coupled to pad 140. Pad 140 may then be used to activate first transistor 120 and second transistor 125, allowing disconnection of the first and third conductive lines from ground using a single pad 140. Alternatively, first transistor 120 and second transistor 125 may be coupled to separate pads such that the transistors may be activated individually. The second and third conductive lines may also be coupled to test pads 152 and 158 (line 105) and test pads 154 and 160 (line 110) to allow electrical testing of the conductive lines.

Fourth conductive line 115 is a comb-like line. Fourth conductive line 115 preferably includes a main portion 116 with projections 118 extending from the main portion. The fourth conductive line is coupled to pad 156, which is configured to receive an electrical probe. Pad 156 may be used for electrical testing of the test structure. Fourth conductive line 115 is preferably a floating line.

The above-described test structure may be used in a voltage contrast inspection test method to test for defects that may have occurred during the formation of conductive features on an integrated circuit elevational profile. After the test structure is formed, the test structure is irradiated with electrons. Preferably, the test structure is irradiated with electrons using a scanning electron microscope ("SEM"). The SEM includes an electron source that is used to create a beam of electrons that is accelerated toward a targeted area of the test structure. As the electrons hit the target area they cause an emission of electrons from the conductive lines. The emitted electrons are collected by a detector. By monitoring the pattern of electrons emitted by the test structure, the absence or presence of defects may be determined.

The electric fields at the sample surface can significantly influence the amount of electrons emitted by the sample. If a conductive line is grounded, a substantial number of electrons that impact the grounded line will be absorbed and transferred to the ground. This absorption of electrons will result in the grounded conductive line appearing much darker than the floating conductive line. As used herein, the term "glowing" refers to the appearance of a floating conductive line when irradiated with electrons. The term "darkened" will herein refer to the appearance of a grounded conductive line when irradiated with electrons. Thus, inspecting the above-described test structure with an SEM will, in the absence of defects, show a pattern that includes alternating glowing lines and darkened lines. The grounded first and third conductive line should appear as darkened lines, while the floating second and fourth conductive lines should appear as glowing lines.

Figure 4:
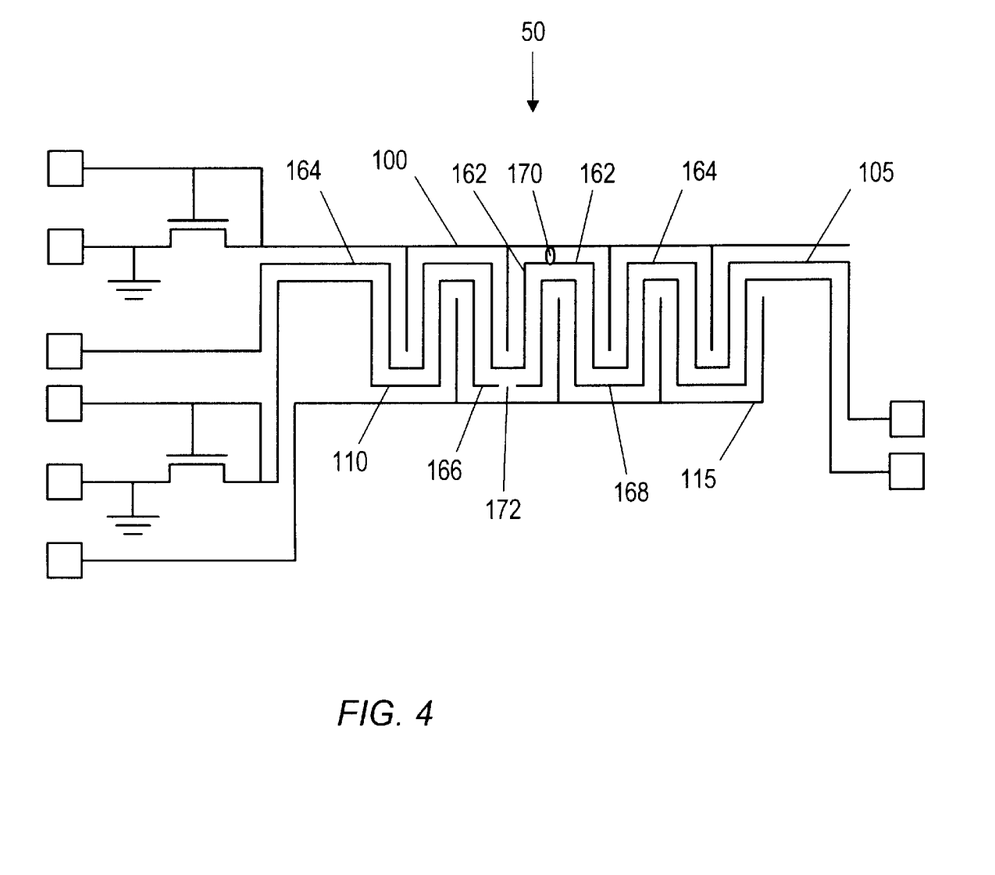
FIG. 4 depicts a schematic view of a test structure in which an extra material defect causes a short between two conductive lines and in which a missing material defect causes an open in another of the conductive lines.

If a defect is present, however, the lines may not show the expected pattern. FIG. 4 depicts a schematic view of test structure 50. If an extra material defect 170 is present in the test structure, causing first conductive line 100 and second conductive line 105 to become shorted, as depicted in FIG. 4, second conductive line 105 will become grounded. At least a portion of the floating second conductive line 105 will become darkened due to the bridging of the lines by the defect. Typically, only a portion of the line in the vicinity of the defect will become darkened under low power scanning conditions. Lower power scanning conditions include conditions in which the incident power of the irradiating electrons drops below about 1000 eV in a test area having a diameter of about 50 $\mu$m. These low-power scanning conditions may be achieved by lowering the power of the incident electrons or by increasing the diameter of the test area.

Under typical voltage contrast scanning conditions, the entire floating second conductive line will become darkened due to bridging of the first and second conductive lines by the defect. Typical scanning conditions include conditions in which the incident power of the irradiating electrons is at or above about 1000 eV and the test area has a diameter at or below about 50 $\mu$m. Under these conditions, the entire floating line may appear darkened due to grounding of the line through the defect. This method allows not only the detection of EMDs, but also allows a rapid method of determining the location of the defect. Traditional methods require inspecting of the entire test structure at a resolution that allows optical detection of the defect. Voltage contrast inspection allows a much coarser scan since a much larger area of the test structure will appear altered due to the presence of a defect.

According to this embodiment, portions 162 of the floating second conductive line 105 in the vicinity of the defect will become darkened due to the bridging of the lines by the defect. The second conductive line, however, will appear to glow at portions 164 of the line farther removed from the defect. Thus, when the region in which the defect is present is scanned, the second conductive line will appear to become darker until the defect is reached. Similarly, a defect that causes a short between the second and third conductive lines 105 and 110 will also cause a portion of the second conductive line to become darkened. A defect that causes a short to occur between the third and fourth lines 110 and 115 may cause a portion of the fourth conductive line to become darkened. Defects may also be sufficient in size to span three or more conductive lines. If an extra material defect contacts both the second conductive line and the fourth conductive line, portions of both the second and fourth conductive lines will become darkened due to grounding through the first and/or third conductive line.

This allows not only the detection of extra material defects, but also allows a rapid method of determining the location of the defect. Traditional methods require scanning of the entire test structure at a resolution that allows detection of the defect. Voltage contrast inspection allows a much coarser scan since a much larger area of the test structure will appear altered due to the presence of a defect.

If a missing material defect is present along either the first or third conductive line, then only a portion of the first conductive line will be grounded. When the test structure is scanned using an SEM only the grounded portion of either the first conductive line 100 or the third conductive line 110 will appear dark. The floating portion of these lines will glow in a manner similar to second and fourth conductive lines. For example, if a missing material defect 172 is present along third conductive line 110, as depicted in FIG. 4, then only a portion 166 of the third conductive line will be grounded. The other portion 168 is now disconnected from ground. When the test structure is scanned using an SEM, only the grounded portion 166 of third conductive line 100 will appear dark. The floating portion 168 will glow in a manner similar to fourth conductive line 115. Thus, during SEM inspection of the test structure, scanning the conductive lines may rapidly allow an open defect to be detected. A sudden change from darkened to glowing indicates not only the presence of a missing material defect, but also the location of the defect.

Figure 5:
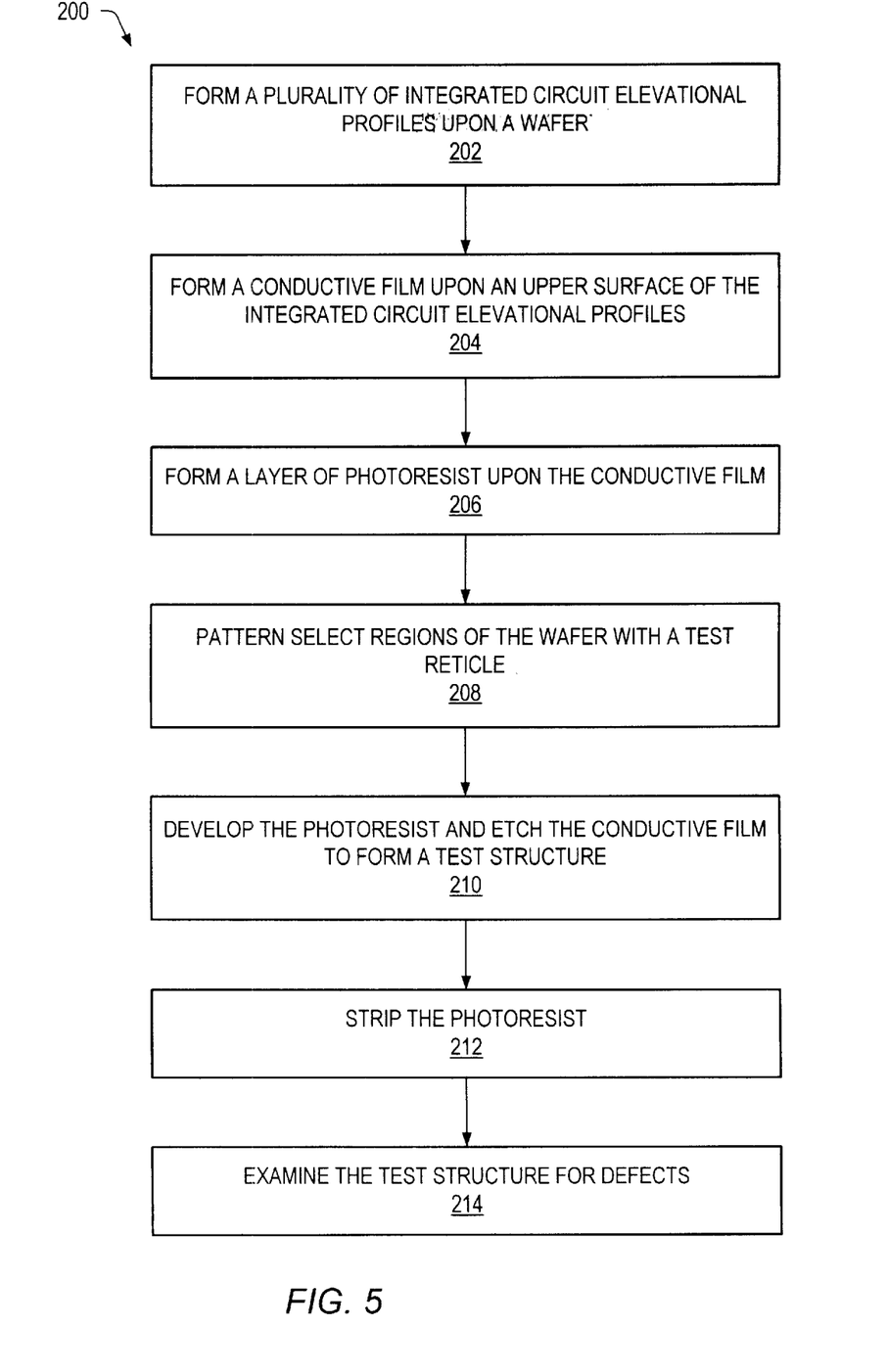
FIG. 5 depicts a flow diagram of a method for forming and testing a test structure upon an integrated circuit elevational profile.

FIG. 5 depicts a flow diagram of a method 200 of forming a test structure to characterize a process for fabricating an integrated circuit. Block 202 describes fabricating a plurality of integrated circuit elevational profiles upon a semiconductor wafer. The wafer is preferably one of a plurality of wafers upon which integrated circuit topographies are formed according to the integrated circuit fabrication methodology. Preferably, the elevational profiles are configured such that each elevational profile occupies an area of the wafer that will subsequently form a chip or die. In an embodiment identified herein as "full flow," the elevational profiles may be fabricated according to a subset of the production methodology designed to produce functional integrated circuits, such that the subset of includes all or substantially all of the processing steps that determine the elevational disparity of the production topography. That is, the full-flow elevational profiles include elevationally complete or substantially elevationally complete integrated circuits except for, e.g., a final metallized layer and passivation layer to be formed upon an upper surface of the topographies. The exact form of the elevational profiles will depend upon the integrated circuits being fabricated.

In an alternative embodiment identified herein as "short flow," the elevational profiles may be fabricated according to a portion of the full flow methodology. Fabrication of the elevational profiles according to the short flow includes suspending processing at an intermediate point prior to completion of the full flow. According to the short flow embodiment, the elevational profiles so formed are preferably designed so that they may be used to form functional integrated circuits if the process flow is continued. The short flow elevational profiles may include a minority of the features found in a production topography or a full flow production elevational profile. Alternatively, the short flow elevational profiles may include a majority, but less than substantially all, of the features found in a production topography or a full flow production elevational profile.

Following fabrication of the integrated circuit elevational profiles, a conductive film may be formed upon the elevational profiles, as shown in block 204. Formation of the conductive film may be accomplished using techniques well known in the art, such as chemical vapor deposition or sputtering. In an embodiment, the conductive film may be a metal, such as aluminum, titanium, or cobalt. Alternatively, the conductive film may be silicided polycrystalline silicon or any other conductive material. A layer of photoresist may then be deposited upon the conductive film, as shown by block 206.

The photoresist may be patterned by exposing select portions of the photoresist to radiation, as shown in block 208 of FIG. 3. Selective removal of portions of the patterned photoresist may be followed by removal of exposed portions of the underlying conductive layer, as shown in block 210, to form a test structure. The remaining photoresist may then be stripped from upon the test structure, as shown in block 212.

Figure 6:
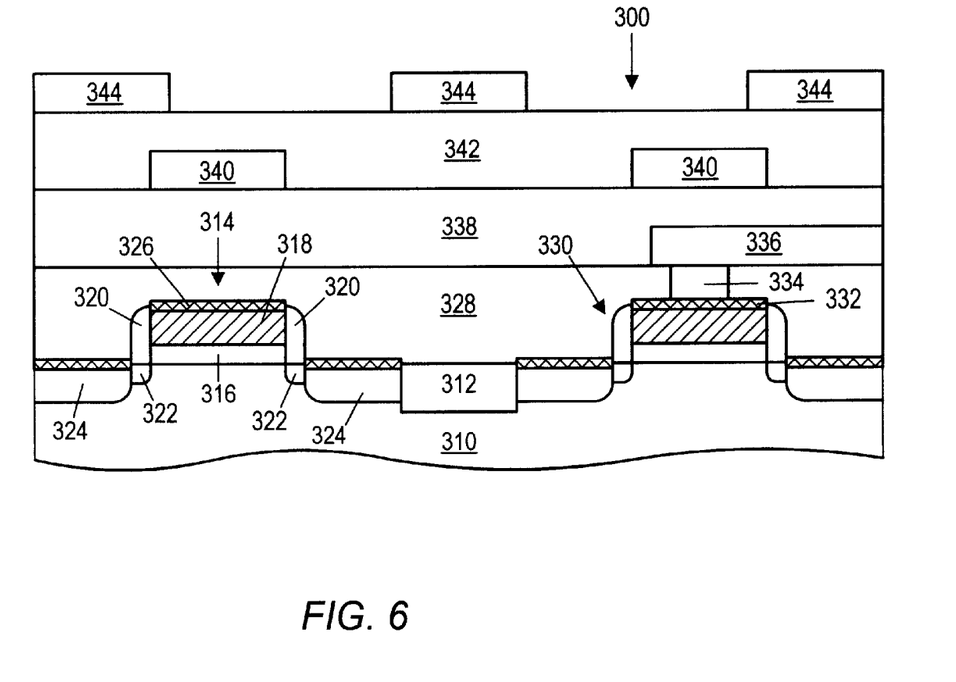
FIG. 6 depicts a cross-sectional view of a substantially completed integrated circuit elevational profile on which a test structure has been formed.

Turning now to FIG. 6, a cross-sectional view of an integrated circuit elevational profile fabricated according to an embodiment of the current methodology is depicted. FIG. 6 shows an elevational profile fabricated according to the full flow methodology. Elevational profile 300 preferably includes a semiconductor substrate 310 upon which a plurality of transistors has been formed. FIG. 6 illustrates exemplary transistors 314 and 330 separated by isolation region 312. As shown in FIG. 6, transistor 314 may include gate conductor 318 formed upon gate dielectric 316. Transistor 314 may further include spacers 320 adjacent sidewall surfaces of the gate conductor, lightly doped drain regions 322 that are formed aligned with sidewall surfaces of the gate conductors, and source and drain regions 324 that are formed self-aligned with the spacers. Silicides 326 may be formed upon upper surfaces of gate conductor 318 and source and/or drain regions 324. It should be noted that not all features depicted need be present in every transistor formed upon the semiconductor substrate and that additional features not depicted may also be present.

First interlevel dielectric 328 is preferably formed across transistors 314 and 330 to isolate them from conductive interconnect lines that may be used to connect select transistors to form an integrated circuit. As depicted in FIG. 6, a first interconnect 336 is formed upon an upper surface of first interlevel dielectric 328. Contact 334 is formed within the first interlevel dielectric to electrically connect transistor 330 with first interconnect 336. As depicted, contact 334 makes electric contact with transistor 330 at silicide 332.

Second interlevel dielectric 338 is shown formed across first interconnect 336 and the upper surface of first interlevel dielectric 328 to electrically isolate first-level interconnects such as interconnect 336 from subsequently formed higher-level interconnects, such as second interconnects 340. The actual number of interconnect and interlevel dielectric levels may vary depending upon design considerations for the integrated circuit. According to a production methodology, a final level of metallization may be formed upon an upper surface of interlevel dielectric 342 in order to substantially complete elevationally fabrication of an integrated circuit. According to the present process, a test reticle may be used to pattern a conductive layer deposited upon interlevel dielectric 342 to form test structure 344 at select die areas upon the wafer. In one embodiment, test structures may be patterned only upon a portion of the die sites, with the remaining die sites being patterned to form production integrated circuits. In an alternative embodiment, the test structures may be patterned upon substantially all die sites on the wafer to test for spatial variation in processing.

Figure 7:
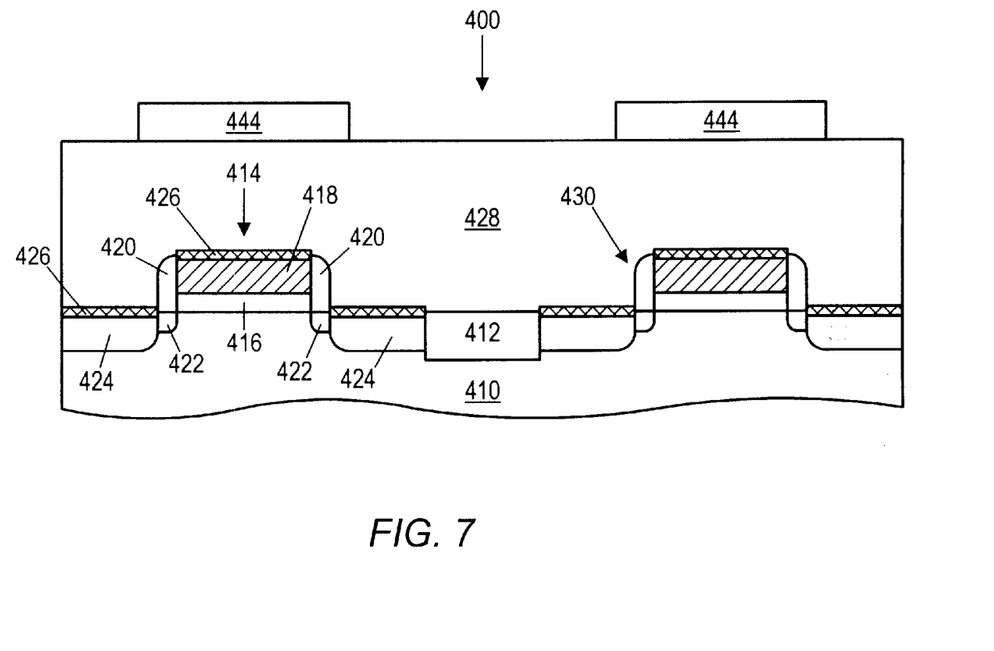
FIG. 7 depicts a cross-sectional view of a partially completed integrated circuit elevational profile on which a test structure has been formed.

FIG. 7 depicts a cross-sectional view of an integrated circuit elevational profile fabricated according to an alternative embodiment of the current methodology. FIG. 7 shows an elevational profile fabricated according to the short flow methodology. Elevational profile 400 preferably includes a semiconductor substrate 410 upon which a plurality of transistors has been formed. FIG. 7 illustrates exemplary transistors 414 and 430 separated by isolation region 412. As shown in FIG. 7, transistor 414 may include gate conductor 418 formed upon gate dielectric 416. Transistor 414 may further include spacers 420 adjacent sidewall surfaces of the gate conductor, lightly doped drain regions 422 that are formed aligned with sidewall surfaces of the gate conductors, and source and drain regions 424 that are formed self-aligned with the spacers. Silicides 426 may be formed upon upper surfaces of gate conductor 418 and source and/or drain regions 424. It should be noted that not all features depicted need be present in every transistor formed upon the semiconductor substrate and that additional features not depicted may also be present.

First interlevel dielectric 428 is preferably formed across transistors 414 and 430 to isolate them from conductive interconnect lines that may be used to connect select transistors to form an integrated circuit. According to a production methodology, a first layer of interconnect (similar to first interconnect 336 depicted in FIG. 6) may be formed upon an upper surface of first interlevel dielectric 428. As depicted in FIG. 7, a test reticle may be used to pattern a conductive layer deposited upon the interlevel dielectric to form test structure 444 (in lieu of the first interconnect) at select die upon the wafer. According to this embodiment, formation of contacts (such as contact 334 depicted in FIG. 6) to the underlying transistors or interconnects is omitted, in order to electrically isolate the test structure from the underlying integrated circuit topography. In one embodiment, test structures may be patterned upon only a portion of the die sites, with the remaining die sites being patterned to form production integrated circuits. In an alternative embodiment, the test structures may be patterned upon substantially all die sites on the wafer to test for spatial variation in processing.

Although FIG. 7 depicts formation of a test structure upon a first interlevel dielectric, it should be noted that according to the short flow methodology, test structures may be formed at any point in the processing sequence. In particular, the test structures as described in the present application may be formed at any point in the processing flow at which a thin conductive layer is patterned.

Returning now to FIG. 5, the test structures may be analyzed for the presence of defects following removal of the photoresist, as shown in block 214. According to an embodiment in which the test structures are similar to test structure 50 depicted in FIG. 2, the wafer may be placed in a scanning electron microscope ("SEM") and irradiated with electrons as described above. Electrons striking conductive lines that are grounded would be expected to sink to ground, such that the grounded lines would appear relatively dark under SEM. In contrast, a portion of the electrons striking floating lines would be expected to be re-emitted, rendering the floating lines relatively bright under SEM. If an open circuit is formed in a grounded line, the portion of the line now isolated from ground would be expected to appear bright under SEM. Open circuits might be formed where the conductor crosses steps or discontinuities on the integrated circuit elevational profile. Open circuits might also be formed where thinning of the lines occurs due, e.g., to poor optical resolution. Further, open circuits might be formed if a contaminant particle is lodged upon the upper surface of the reticle during patterning of negative photoresist such that radiation is not properly transmitted to a portion of the photoresist. The resulting pattern may contain an unintended "hole" in the conductive trace.

In addition, a short circuit may be formed between a floating line and a grounded line. For example, particulate matter deposited on the upper surface of the reticle may result in improper patterning of the test structure, such that extra material is included in the test structure patterned upon the integrated circuit elevational profile. Alternatively, particulate matter may deposit upon the test structure and connect the floating line to the grounded line. According to a further alternative, the short circuit may be formed due to poor optical resolution of the test pattern. If a short circuit is formed between a floating line and a grounded line, a portion of the floating line in the vicinity of the short would be expected to appear darkened under SEM due to grounding of the floating line.

According to an embodiment, a test reticle may be used to pattern select chip sites upon a wafer or a plurality of wafers. The select chip sites may include sites previously selected to receive test structures as part of routine monitoring of the fabrication process. For example, test structures may be formed upon several pre-selected sites of a single wafer on, e.g., a daily or weekly basis to ensure that the resulting product chips meet design criteria.

Alternatively, the select sites may be patterned with the test reticle rather than a production reticle in response to problems discovered during testing of finished production wafers. In this embodiment, the selected chip sites on which test structures are formed are sites that otherwise would have been used for fabricating production integrated circuit topographies (i.e., the selected sites are not previously dedicated test sites). For example, electrical testing of finished wafers may reveal defects in the chips. As such, the test reticle may be used to pattern test structures upon selected chip sites of wafers at various stages of production to isolate processing steps after which the defects are introduced. Further action may then be taken to identify the processing conditions or equipment responsible for the defects and to effect repairs or changes necessary to produce usable product. Test structures may be formed with an increased frequency (e.g., upon one or more wafers in each batch loaded into the process to be corrected) for continued testing until the problem is resolved.

According to a further alternative, test structures may be formed across an entire wafer to enable identification of intra-wafer or spatial variations in processing. For example, formation of test structures across an entire wafer may reveal a regular pattern of defects across the wafer attributable to systematic errors in processing. Forming test structures across an entire wafer may also reveal that processing conditions vary between the center of the wafer and the edges such that functioning integrated circuits are produced only in certain regions of the wafer rather than across the entire wafer. According to this embodiment, the test structures may be formed either on substantially complete or on partially complete production elevational profiles.

Figure 8:
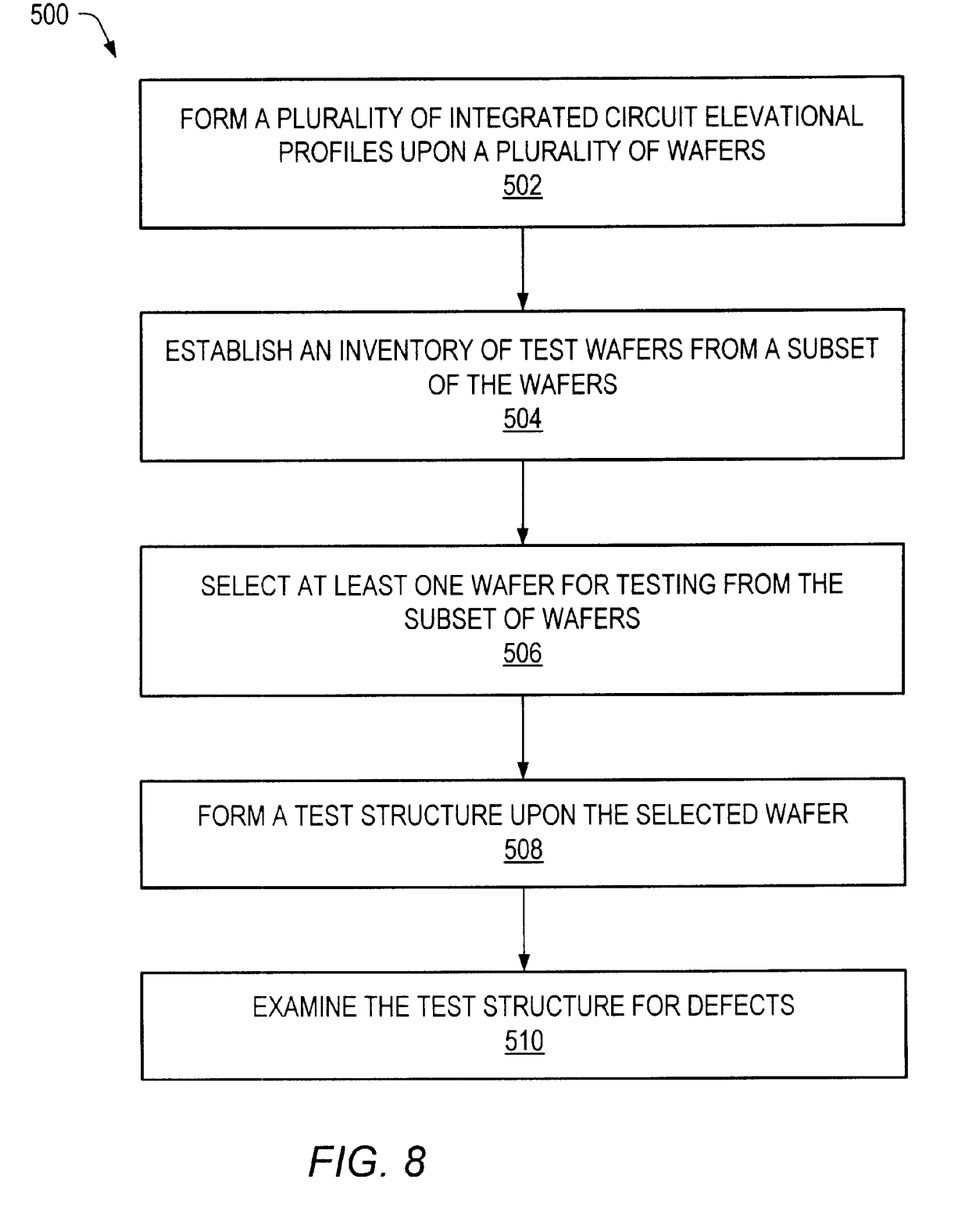
FIG. 8 depicts a flow diagram of a method for characterizing an integrated circuit fabrication methodology.

FIG. 8 depicts a flow diagram of a method 500 of using a test structure to characterize a process for fabricating an integrated circuit. According to method 500, a plurality of integrated circuit elevational profiles may be formed upon a corresponding plurality of semiconductor wafers, as shown in block 502. The elevational profiles may be formed according to either the full flow or the short flow, as described above. A subset of the wafers may then be used to establish an inventory of wafers, as shown in block 504. That is, the wafers may be removed from production and "stockpiled" at various points in the fabrication process. Such an inventory may be dedicated for testing purposes. Alternatively, the inventory may be a stockpile of wafers intended for future production use.

At least one semiconductor wafer upon which an integrated circuit elevational profile is formed may be selected from the inventory, as shown in block 506. A test structure may then be formed upon the integrated circuit topography, as shown in block 508. According to an embodiment, the test structure may be formed using a method similar to the method described above. Following formation of the test structure, optical and/or electrical testing may be performed on the test structure to identify defects, as shown in block 510.

Figure 9:
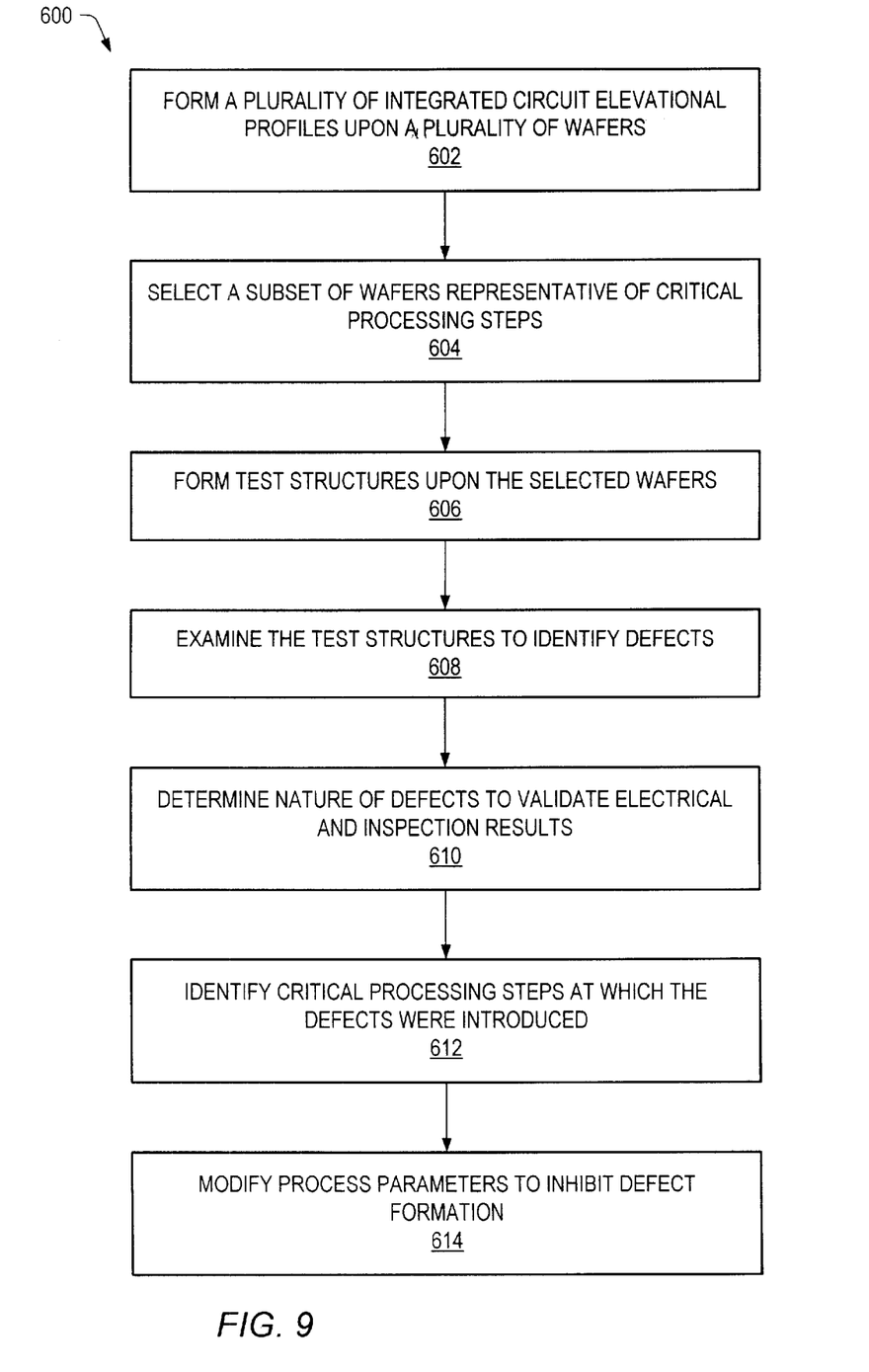
FIG. 9 depicts a flow diagram of an alternative method for characterizing an integrated circuit fabrication methodology.

FIG. 9 depicts a flow diagram of an additional method 600 of using a test structure to characterize an integrated circuit fabrication methodology and to identify and correct failures in the process. Method 600 may be used to identify processing steps at which defects are introduced into integrated circuits during fabrication. For example, electrical testing of finished wafers may reveal the presence of defects. It would then be necessary to identify the processing step or steps at which the defects were introduced in order to allow corrective action to be taken.

As shown in block 602, a plurality of integrated circuit elevational profiles may be fabricated upon a corresponding plurality of semiconductor wafers according to the fabrication process. A subset of processing steps may be identified as critical processing steps. For purposes of this application "critical processing steps" means those processing steps deemed by the fabricator to be steps at which defects are considered most likely to be introduced into the integrated circuits. For example, critical processing steps may include metallization steps during which conductive interconnects are formed as a part of the integrated circuit topography.

From the plurality of wafers, a subset of wafers may be selected that represents critical processing steps, as shown in block 604. Test structures, similar to the test structures previously described, may then be formed upon at least one chip site on each of the selected wafers, as shown in block 606. The test structures may then be examined to identify defects in the integrated circuits, as shown in block 608. As shown in block 610, the nature of the observed defects (e.g., open or shorted circuits) may then be determined and the results of electrical and inspection techniques compared to validate the test results.

By examining the relative defectivity of the wafers selected from the various critical processing steps, critical processing steps before and after which defects are introduced into the integrated circuits may be identified, as shown in block 612. For example, optical testing may be used to isolate at least one of the processing steps after which defects are introduced into the wafers. That is, test structures formed on wafers removed from production before the isolated step may exhibit no defects, whereas test structures formed on wafers removed from production at steps subsequent to the isolated step may contain shorts and/or opens. After identifying the critical processing steps before or after which defects are introduced, process parameters may be modified in order to inhibit defect formation, as shown in block 614. Test structures may then be formed upon wafers processed according to the new operating conditions to establish that the changes eliminate defect formation from the process.

For example, test structures formed on topographies fabricated through a first metallization process may be substantially defect-free, whereas test structures formed on topographies fabricated through a second metallization process may indicate the presence of defects in the integrated circuits. Operators may then more closely examine processing steps between the first and second metallization processes to identify precisely when defects are introduced. It should be noted that the defects are not necessarily introduced during the critical processing steps themselves. Rather, due to the large number of steps involved in the fabrication of integrated circuits, examination of test structures formed at designated critical steps in the process provides a coarse screen that may then be refined. Processing parameters such as temperature, pressure, or material composition may be adjusted for processing steps between the identified critical processing steps. The process equipment may be examined for the presence of particulate material or malfunctioning components as well.

It will be appreciated to those skilled in the art having the benefit of this disclosure that this invention is believed to provide a test structure for characterizing a production integrated circuit methodology and a production integrated circuit topography, a reticle for patterning the test structure, and a method for fabricating the test structure. It will be further appreciated to those skilled in the art having the benefit of this disclosure that this invention is believed to provide a method for using the test structure to characterize the production integrated circuit topography and the production integrated circuit methodology. Further modifications and alternative embodiments of various aspects of the invention will be apparent to those skilled in the art in view of this description. It is intended that the following claims be interpreted to embrace all such modifications and changes and, accordingly, the specification and drawings are to be regarded in an illustrative rather than a restrictive sense.

What is claimed is:

1. An apparatus for characterizing an integrated circuit fabrication process, comprising:

a die area;

an elevational profile formed within the die area by one or more selected steps from a sequence of steps culminating in an integrated circuit intended for use by a consumer of a product embodying the integrated circuit fabrication process, wherein the one or more selected steps includes fewer steps than does the sequence of steps; and a test structure residing upon the elevational profile, wherein the test structure is responsive to stimuli, and wherein an entirety of the test structure is electrically isolated from any conductive features within the elevational profile.

2. The apparatus as recited in claim 1, wherein the elevational profile is identical with an elevational profile formed by a minority of steps used to produce the integrated circuit.

3. The apparatus as recited in claim 1, wherein the elevational profile is identical with an elevational profile formed by a majority of steps used to produce the integrated circuit.

4. The apparatus as recited in claim 1, wherein portions of said test structure are configured to vary in brightness in response to exposure to electrons from an electron microscope.

5. The apparatus as recited in claim 1, wherein the test structure is configured to detect problems present in the integrated circuit fabrication process during use.

6. The apparatus as recited in claim 1, wherein the test structure is configured to detect elevational disparities upon said elevation profile.

7. The apparatus as recited in claim 1, wherein the test structure is configured to detect particulate material introduced into said integrated circuit fabrication process.

8. The apparatus as recited in claim 1, wherein the test structure is configured to detect spatially dependent defects.

* * * * *